United States Patent [19]

Shaar

[11] Patent Number: 5,157,620
[45] Date of Patent: Oct. 20, 1992

[54] METHOD FOR SIMULATING A LOGIC SYSTEM

[75] Inventor: Zakwan Shaar, Stockport, Great Britain

[73] Assignee: International Computers Limited, London, England

[21] Appl. No.: 322,348

[22] Filed: Mar. 13, 1989

[30] Foreign Application Priority Data

May 31, 1988 [GB] United Kingdom ............... 8812849

[51] Int. Cl.⁵ ............................................. G06F 15/16
[52] U.S. Cl. .................................... 364/578; 395/500
[58] Field of Search ............. 364/200, 900, 569, 578; 395/500; 371/23

[56] References Cited

U.S. PATENT DOCUMENTS

| | | | |
|---|---|---|---|
| 4,472,789 | 9/1984 | Sibley | 364/900 |
| 4,677,541 | 6/1987 | Singhi | 364/569 |
| 4,725,971 | 2/1988 | Doshi et al. | 364/578 |
| 4,751,637 | 6/1988 | Catlin | 364/200 |
| 4,901,260 | 2/1990 | Lubachevsky | 364/578 |

OTHER PUBLICATIONS

Abramovici et al.; "A Logic Simulation Machine"; IEEE Tran. CAD of Intog. Circuit and Syst.; Apr. 1983.
Howard et al.; "Parallel Processing Interactively Simulates Complex VSLI Logic"; Electronics Dec. 1983.
Van Norstrand; "Encyclopedia of Computer Science"; Litton Educational Publishing 1976.
Ulrich: Serial/Parallel Event Scheduling for the Simulation of Large Systems, Proceedings of the 1968 ACM National Conference pp. 279-287.

Primary Examiner—Parshotam S. Lall
Assistant Examiner—Ellis B. Ramirez
Attorney, Agent, or Firm—Lee, Mann, Smith, McWilliams, Sweeney & Ohlson

[57] ABSTRACT

A logic simulator has a time loop with a number of time slots into which events are scheduled. The events are wrapped around the loop, so that event times corresponding to different cycles around the loop may be simultaneously present on the loop. This allows a small loop size to be used, which improves performance. Preferably, the loop size is a prime number. If a complete cycle of the loop is made without finding any non-empty slots a jump is made to the next event time, so as to speed up the processing. In one described embodiment, the loop size is static, while in a second described embodiment the loop size is dynamically varied to minimize the insertion of events with different event times into the same slot.

11 Claims, 4 Drawing Sheets

5,157,620

METHOD FOR SIMULATING A LOGIC SYSTEM

BACKGROUND TO THE INVENTION

This invention relates to logic simulators. Such simulators are used, for example, for simulating the operation of complex digital electronic systems, so as to allow the design of the system to be tested and verified without the necessity for constructing an actual hardware prototype of the system.

One known form of logic simulator is described in "Exclusive Simulation of activity in digital networks" by E. G. Ulrich, Communication of the ACM, February 1969, page 102.

The above paper describes a simulator in which operation of the simulated system is represented as a sequence of events. An event may consist, for example, of a transition in the level of a logic signal. The simulator includes a time loop comprising L time slots. Each slot contains a pointer, which points to a list of events that are scheduled to occur at the time corresponding to this time slot. Specifically, an event with event time T is linked to the list for time slot T MOD L (i.e. the remainder after dividing T by L).

In operation, the slots are scanned cyclically to simulate the passage of time. As each slot is scanned, the events in the associated list are processed by calculating their effects on the simulated system. This will, in general, cause further events to be created: for example, a change in state at the input of a logic gate may cause a change in state at the output of the gate after a specified time delay. Whenever a new event is created, it is linked to the event list of the appropriate time slot, so that it will be processed at the correct simulated time.

The above paper teaches that the maximum element delay for the simulated system should normally not exceed the loop length L, so that, at any given time, all the events on the loop must relate to the same cycle around the loop. A consequence of this is that, if the simulated system includes elements with a wide range of delay times, it will be necessary to provide a very large loop. i.e. to make L very large. However, a large loop can degrade the preformance of the simulator.

One way of avoiding large loops, suggested by the above paper, is to use a special extension list, or a second loop, linked to the first slot of the loop, for temporarily holding events whose delay time is greater than the loop length. However, this introduces extra complexity, and slows down the simulation since extra time is required to transfer the contents of the extension list to the main loop.

One object of the present invention is to provide a way of avoiding large loop sizes, without using such an extension list or extra loop.

SUMMARY OF THE INVENTION

According to the invention, there is provided a logic simulator comprising:

(a) a time loop having a plurality of time slots, each time slot being associated with a plurality of different simulation time values corresponding to successive cycles around the time loop, (b) scheduling means for inserting simulation events into time slots, each event having an event time value, and each event being inserted into a time slot corresponding to the event time value of that event, irrespective of the presence of any other events in that time slot with event time values corresponding to different cycles around the time loop, (c) means for maintaining a current simulation time value, and for incrementing said current simulation time value to simulate passage of time, and (d) means for accessing the time slot corresponding to the current simulation time value, and for processing only events in that time slot whose event time values are equal to the current simulation time value.

It can be seen that the present invention removes the requirement that the loop length be larger than the maximum delay time, by allowing events to "wrap around" the time loop, so that, at any given time, events from a number of different cycles may be present simultaneously on the loop.

In one form of the invention, the loop length (i.e. the number of slots in the loop) is constant. It has been found that a loop length of less than 20 is advantageous, and that a prime number is preferable. In one specific embodiment, a loop length of 7 is chosen. A prime number is advantageous because, in general, in a digital electronic system, large delays are multiples of a specified clock time, and do not normally occur in multiples of a prime number. Hence, the use of a prime number reduces the probability that events from different cycles of the time loop will be mapped into the same time slot.

In another form of the invention, the loop length is variable. It may be initially set at a minimum value, and then increased each time an attempt is made to place an event in a time slot that already contains one or more events with a different event time.

According to a preferred feature of the invention, the simulator comprises means operative during a cycle of the loop in which no events with event times equal to the current simulation time are encountered, for determining the earliest event time in the loop and for causing the current simulation time to jump to that earliest event time. This allows simulated time to be advanced more rapidly, particularly in the case where the simulated system involves large delay times. This feature exploits the small loop size.

BRIEF DESCRIPTION OF THE DRAWINGS

Two logic simulators in accordance with the invention will now be described with reference to the accompanying drawings.

DESCRIPTION OF EMBODIMENTS OF THE INVENTION

Figure 1:
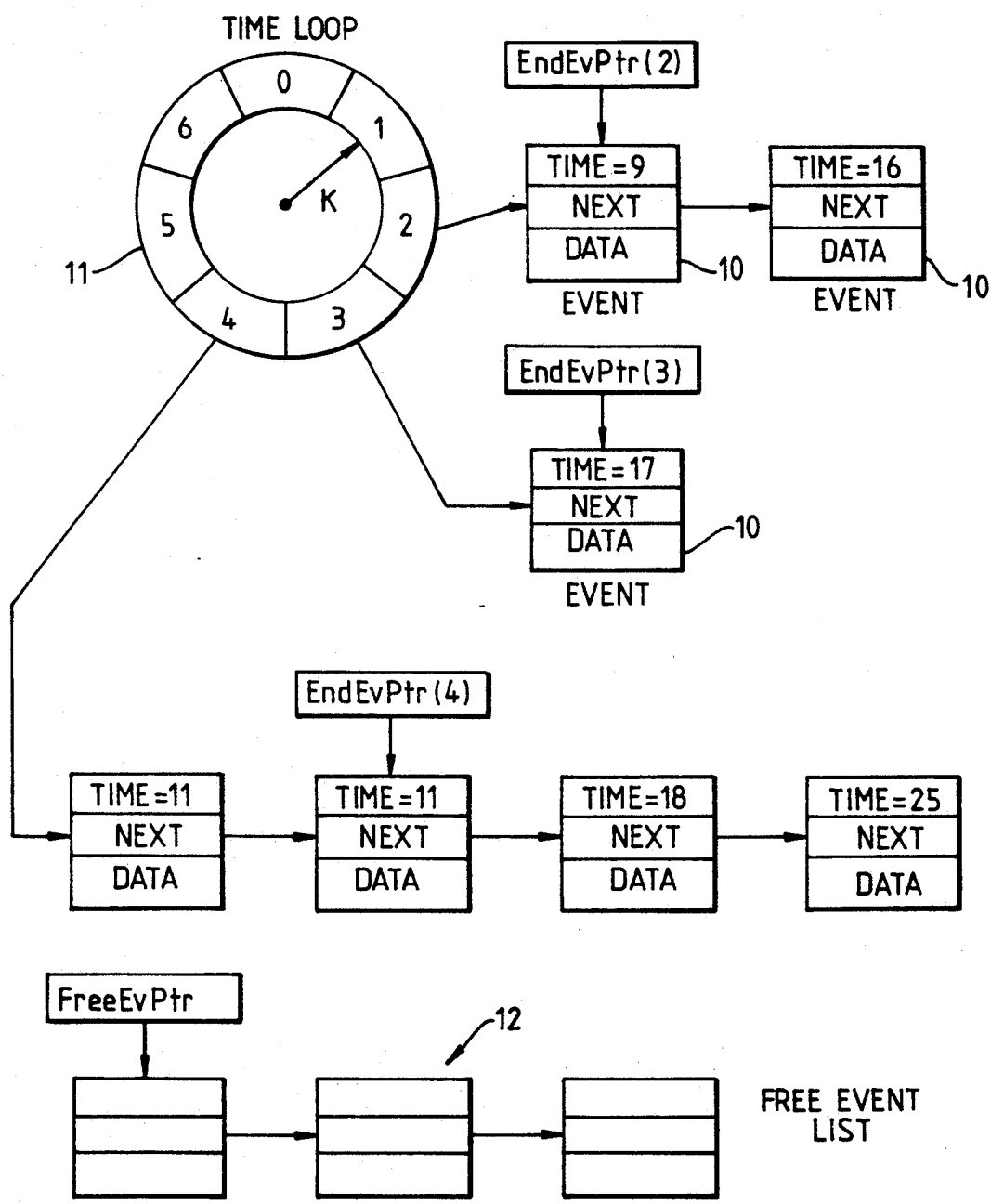
FIG. 1 is a schematic diagram showing the data structures used by the simulators.

Referring to FIG. 1, each scheduled event in the simulated system is represented by an event notice 10, comprising an array of data having a number of fields including the following:

TIME: the event time. This represents the time at which the event is scheduled to be processed.

NEXT: this is a pointer to another event, and is used for chaining events together to form event lists.

DATA: this represents the nature of the event. For example, it may specify a change in logic level of a particular signal in the simulated system.

The simulator uses a time loop 11, comprising a plurality of time slots. The number of slots in the loop is referred to as LoopSize. In this particular example, LoopSize=7. Each slot holds a pointer to an event, or list of events, that has been scheduled into this slot.

When an event is scheduled, it is placed in the list in time slot t where t=TIME MOD LoopSize.

For example, in FIG. 1, the event with TIME=9 is scheduled in slot 2 (since 9 MOD 7=2) Within each list, the events are linked together in chronological order, starting with the earliest event (i.e. the lowest value of TIME).

It can be seen that each slot can therefore hold events with a number of different event times, corresponding to different cycles around the time loop. Specifically, time slot t can hold events with times t+n. LoopSize, where n=0, 1, 2, ---.

Each list has a pointer EndEvPtr associated with it. This points to the last event with the earliest event time on the list. For example, in the case of the list in slot 4, the earliest event time on the list is 11. There are two events with this event time, and so the pointer EndEvPtr(4) is set to point to the second of these two events. In the case where there is only one event with the earliest event time (as in the case of slots 2 and 3), EndEvPtr points to this event.

Where no events have been allocated to a slot, the pointer in the slot is set to point to a dummy event, whose TIME field is set to maximum possible integer that can be represented by that field.

Whenever an event is processed, its event notice is released, and is linked into a list of free events 12. A pointer FreeEvPtr points to the first event in this list. When a new event is created, a free event is removed from this list and used to store the event. If there are no free events currently available, a new event notice is created.

The simulator maintains the following variables.

CURTIME: this is a pointer to the current value of simulated time, and is used to select the event that is to be processed next.

FirstEvTime: this points to the earliest event time currently scheduled on the time loop. It is initially set to the maximum possible value, and is updated each time an earlier event is added to the time loop.

LastEvTime: this points to the latest event time currently scheduled. It is initially set to the minimum possible value, and then updated each time a later event is added to the loop.

SevCount: this is a count of the number of events scheduled during the current simulation. It is initially set to zero, and is incremented by one each time an event is scheduled on to the time loop.

PevCount: this is a count of the number of events processed during the current simulation. It is initially set to zero and is incremented each time an event is processed.

SimTime: this indicates the number of units of simulated time for which the simulation is to be continued.

Figure 2:
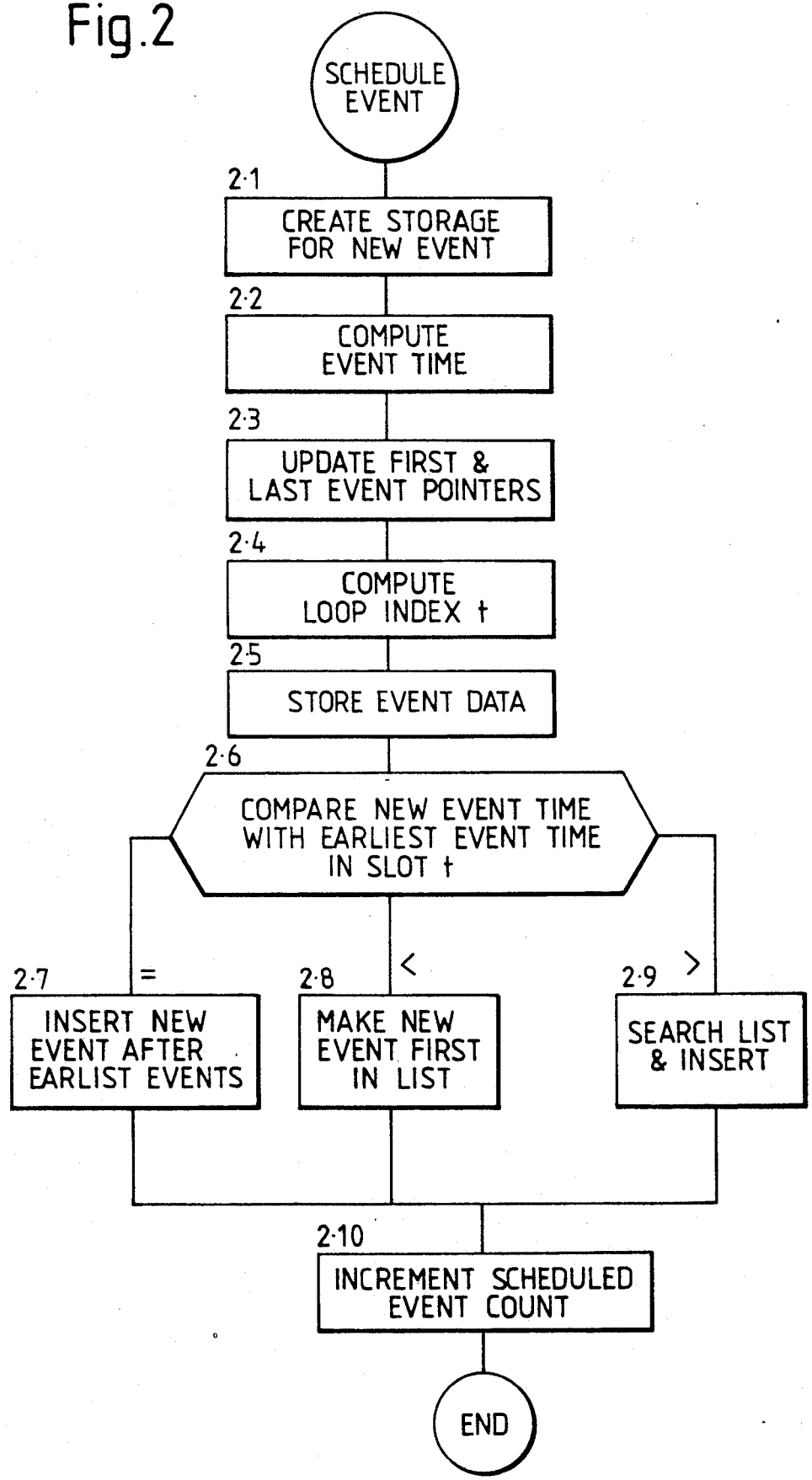
FIG. 2 is a flow chart of an event scheduling routine forming part of the first simulator.

Referring now to FIG. 2, this shows the routine for scheduling a new event on to the time loop.

(2.1) The first action is to create storage for the event. If FreeEvPtr has a null value, there are no free event notices available in the free event list, and a new event notice is created. Otherwise, the first event notice in the free event list is allocated to the new event, and FreeEvPtr is advanced to point to the next free event notice.

(2.2) The event time for the new event is calculated, by adding the delay time for the event to CurTime. This is then stored in the TIME field of the event.

(2.3) The calculated event time is compared with FirstEvPtr and LastEvPtr. If the event time is less than FirstEvPtr, then this pointer is set equal to the event time. Similarly, if the event time is greater than LastEvPtr, this pointer is set to the event time. This ensures that these two pointers are kept up to date as records of the earliest and latest events currently scheduled on the loop.

(2.4) A loop index t for the event is calculated as follows:

t=TIME MOD LoopSize.

This indicates the time slot into which the new event is to be inserted.

(2.5) The event data, specifying the nature of the event, is stored in the DATA field of the new event.

(2.6) The TIME field of the new event is now compared with the TIME field of the event indicated by EndEvPtr(t), i.e. the earliest existing event time currently in slot t.

(2.7) If these TIME fields are equal, the new event is linked into the list at the position immediately following the event indicated by EndEvPtr(t). This ensures that events with the same event time will be processed in first-in-first-out order. EndEvPtr(t) is then set to point to the new event.

(2.8) If the event time of the new event is less than that of the earliest existing event in slot t, then the new event is inserted at the head of the list. EndEvPtr(t) is then set to point to the new event.

(2.9) If the event time of the new event is greater than that of the earliest existing event time slot t then the list is scanned, starting from the event indicated by EndEvPtr(t) looking for an event with TIME greater than that of the new event. The new event is then inserted into the list immediately before that event. If there is no greater event time in the list, the new event will be linked to the end of the list.

It will be appreciated that linking a new event to a list is achieved by setting the NEXT field of the event to point to the next event in the list, and setting the NEXT field of the preceding event in the list to point to the new event. Alternatively, if the new event is to be inserted at the head of the list, the pointer in the time slot is set to point to the new event.

(2.10) Finally, the scheduled event count SevCount is incremented by one.

For example, suppose that it is required to schedule a new event, with event time equal to 11. The loop index is therefore t=11 MOD 7=4. That is, the new event is to be inserted into slot 4.

The earliest event time currently in slot 4 is 11. Since this is equal to the event time of the new event, the new event will be inserted immediately after the last event with event time equal to 11, i.e. it will become the third event in the list.

Alternatively, suppose that the new event has event time equal to 18. In this case, the list attached to slot 4 is scanned, starting from the last event with event time equal to 11 and the event is inserted as the fourth event in the list.

Figure 3:
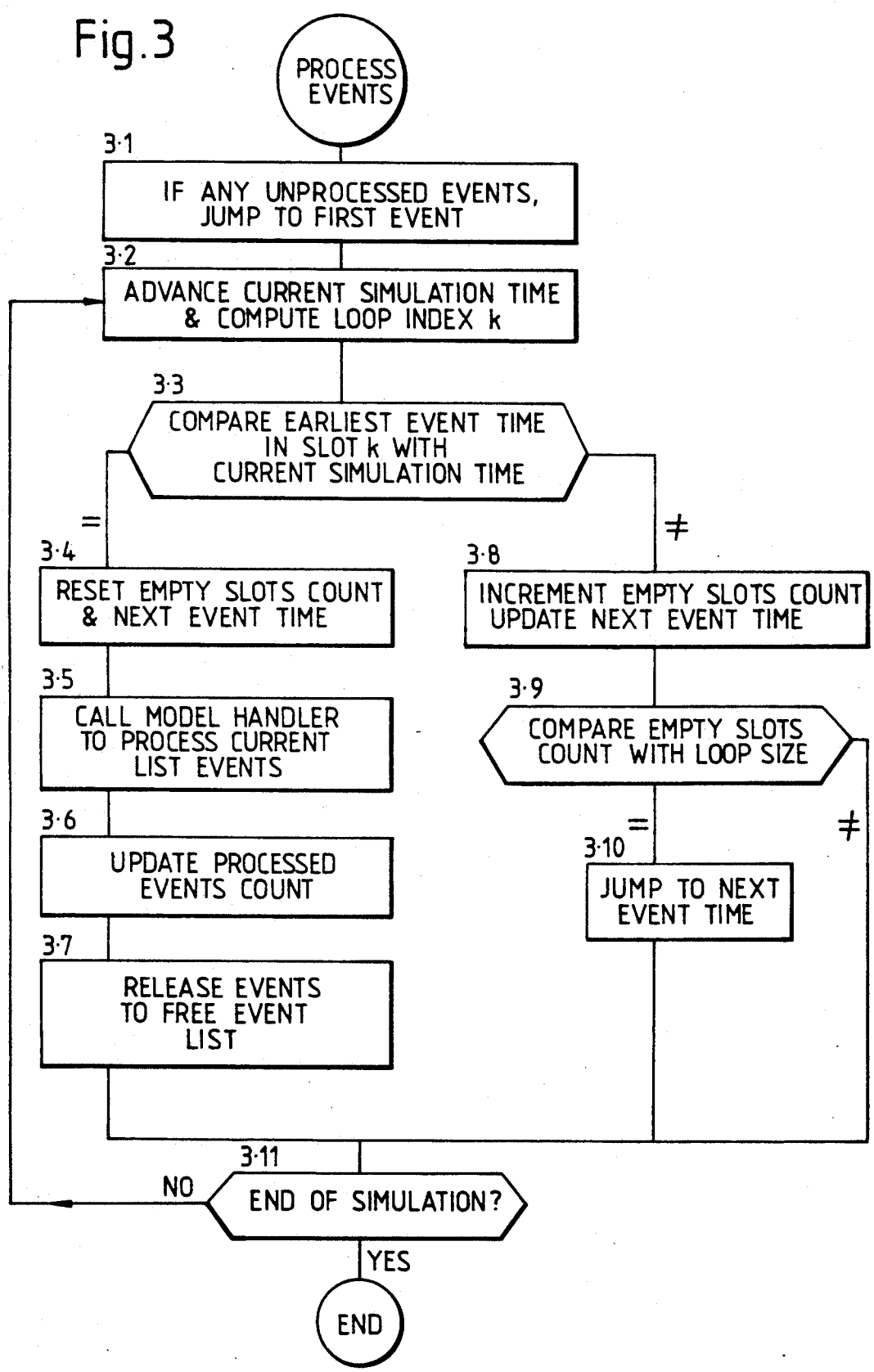
FIG. 3 is a flow chart of an event processing routine forming part of the first simulator.

Referring now to FIG. 3, this shows the routine for processing events, so to carry out the required simulation.

(3.1) The routine first checks whether there are any unprocessed events, i.e. whether SevCount−PevCount is greater than zero. If so, a jump is made to the first unprocessed event by setting CurTime=FirstEvTime −1.

(3.2) The current simulation time is advanced, by incrementing CurTime by one. A current loop index k is then calculated as follows:

K=CurTime MOD LoopSize.

This points to the slot that holds the events (if any) to be processed at the current simulation time.

(3.3) Now the current simulation time CurTime is compared with the earliest event time in slot k, i.e. with the TIME field of the event indicated by EndEvPtr(k).

(3.4) If these times are equal, this means that the slot is not empty i.e. that there is at least one event in the slot which has to be processed at the current simulation time. A variable EmptySlots is set to zero, and another variable NextEventTime is set to SimTime. The purpose of these two variables will be explained later.

(3.5) A call is now made to a MODEL HANDLER program, which processes all the current events in the slot. The processing of an event involves calculating the effects of the event on the simulated system, and generating new events as necessary. When a new event is generated, the MODEL HANDLER calls the event scheduler routine (FIG. 2) to schedule the new event on to the loop. The MODEL HANDLER program may be conventional, and forms no part of the present invention, and so it is not necessary to describe it in any further detail.

(3.6) The value of PevCount is then updated, by adding to it the number of events processed by the MODEL HANDLER.

(3.7) The events that have been processed are now released to the free event list, so that they are available for re-use. If there are any events remaining in slot k, EndEvPtr(k) is advanced to point to the last event with the earliest event time in the slot.

(3.8) If, on the other hand, the current simulation time is not equal to the earliest event time in slot k, the slot is empty i.e. there are no events in the slot ready to be processed at the current simulation time. (There may, of course, be events which will be processed during subsequent cycles around the loop). The variable EmptySlots is therefore incremented by one. Thus, EmptySlots keeps a count of the number of consecutive empty slots encountered. Also, if the earliest event time in the slot is less than NextEventTime, then NextEventTime is updated to this earliest event time. Thus, NextEventTime keeps track of the earlist event time encountered since the last non-empty slot.

(3.9) EmptySlots is compared with LoopSize.

(3.10) If they are equal, this means that a complete cycle around the loop has been performed without encountering any non-empty slots. Thus, NextEventTime must now equal the earliest event time on the loop as a whole. A jump is therefore made to this earliest event, by setting CurTime=NextEventTime −1.

This greatly speeds up the simulation process, especially where widely spaced events are present.

(3.11) The above steps 3.2–3.10 form the main loop of the event processing routine. This loop os repeated until either
(a) CurTime reaches SimTime, or
(b) CurTime reaches LastEventTime, or
(c) an error is detected.

The simulation then terminates, and the results of the simulation are printed out in the conventional manner.

The simulator described above is static, in the sense that it uses a time loop of fixed size, i.e. LoopSize is constant while the simulator is in operation. Another embodiment of the invention will now be described in which LoopSize is dynamically variable.

The event scheduling routine for this dynamic embodiment is similar to that of FIG. 2. However, in this case, the first action of the routine is to compare the event time of the new event with that of the first event already scheduled in the relevant time slot. If they are not equal, then a loop resizing routine is called, to increase the size of the loop.

Figure 4:
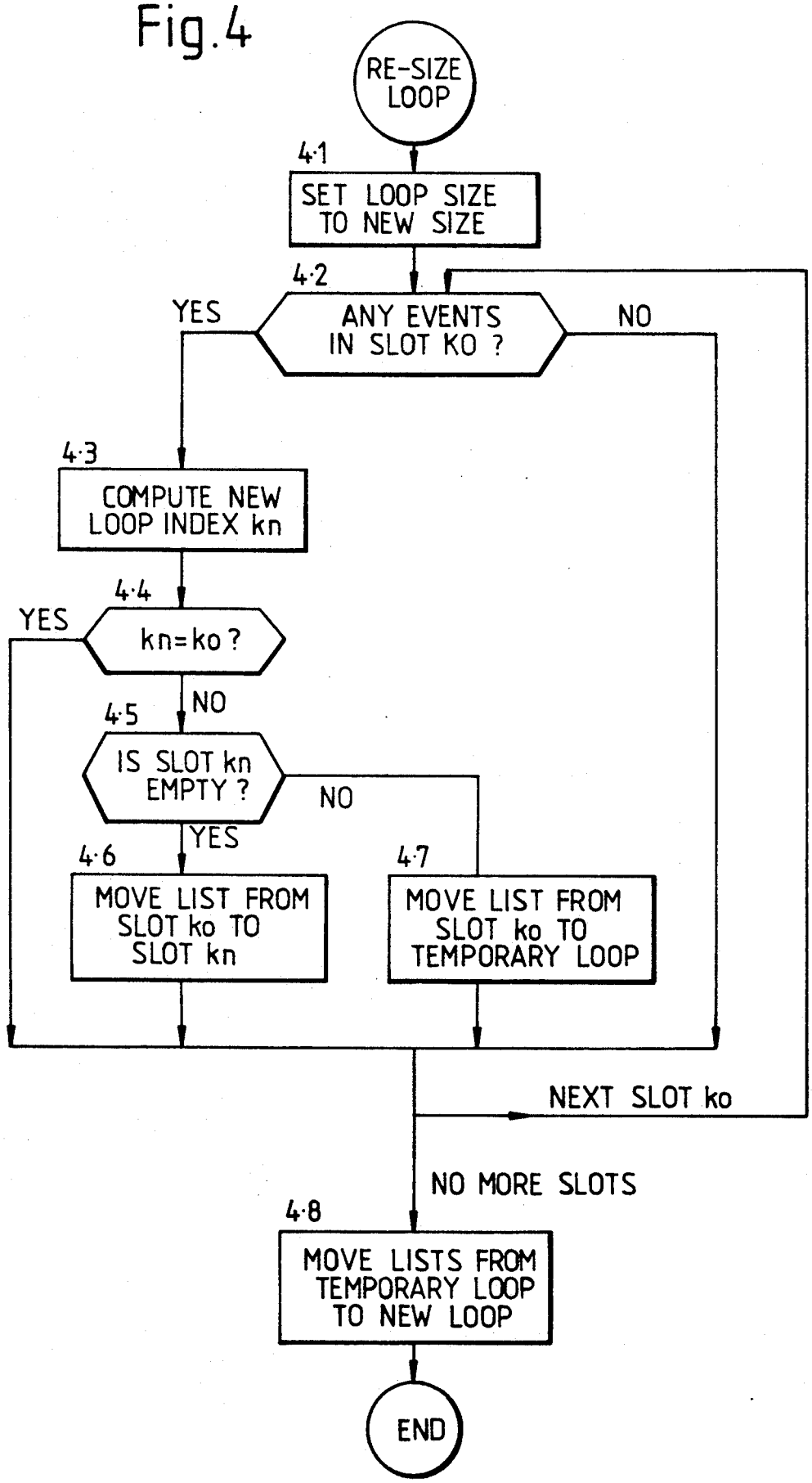
FIG. 4 is a flow chart showing a loop re-sizing routine forming part of the second simulator.

Referring now to FIG. 4, this shows the loop resizing routine.

(4.1) The first step is to set the value of LoopSize to the new size. In this example, LoopSize is initially set at a minimum value 3, and then incremented through the series of values 7, 11, 13 ---up to a predetermined maximum value. In other words, LoopSize follows the sequence of prime numbers, excluding 5. Thus, for example, if the current LoopSize=7, then it is increased to 11.

(4.2) Each slot ko in the existing loop is now examined in turn, to determine whether it contains any events.

(4.3) If slot ko contains any events, then a new loop index kn is calculated for the events, as follows:

kn=TIME MOD LoopSize.

where LoopSize is now the new size.

(4.4) The old slot index ko is then compared with the new slot index kn. If they are equal, no further action is necessary.

(4.5) If, on the other hand, ko is not equal to kn, then slot kn on the expanded loop is examined to determine whether it contains any events.

(4.6) If slot kn is empty, then the list of events currently in slot ko is moved to the new slot kn.

(4.7) If, on the other hand, slot kn is not empty, then the list of events currently in slot ko is moved to a temporary storage loop.

(4.8) When all the slots of the existing loop have been examined, each list on the temporary loop is moved to the appropriate slot of the expanded loop. If this slot already contains a list of one or more events, then it is necessary to merge the lists, using a scheduling procedure similar to that described above with reference to FIG. 2, to ensure the correct chronological sequencing.

In summary, it can be seen that the loop resizing routine increases the loop size, and re-schedules the events on the loop into the correct time slots for the new loop size.

The event processing routine for this dynamic embodiment of the invention is similar to that shown in FIG. 3, with the following modifications.

(a) Between steps 3.5 and 3.6, it is necessary to recompute the loop index k, since the loop size may have been changed as a result of creation and scheduling of new events by the MODEL HANDLER.

(b) At the end of the event processing routine, the loop size is decreased to the previous value.

It can be seen that the effect of this dynamically variable loop size is to minimise the insertion of events with different event times into the same slot. This improves efficiency since it reduces the need to scan lists of events, looking for the correct place in which to insert a new event.

I claim:

1. A method of simulating a logic system, comprising the steps:
   (a) maintaining a data structure representing a cyclic time loop having a plurality of time slots, each time slot being associated with a plurality of different simulation time values corresponding to successive cycles around the time loop,
   (b) inserting simulation events into the time slots, each event having an event time value, and each event being inserted into a time slot corresponding to the event time value of that event, events with different event time values corresponding to different cycles around the time loop being simultaneously present in a single time slot,
   (c) maintaining a current simulation time value, and incrementing said current simulation time value to simulate passage of time, and
   (d) accessing the time slot corresponding to the current simulation time value, comparing the event time values of events in that time slot with the current simulation time value, and processing only events in that time slot whose event time values are equal to the current simulation time value.

2. A method according to claim 1, wherein the step of inserting simulation events comprises inserting an event with event time value T into time slot T MOD L, where L is the number of time slots in the loop.

3. A method according to claim 1, including the further steps of detecting a cycle of the loop in which no events with event time values equal to the current simulation time value, determining the earliest event time value in the loop, and causing the current simulation time to jump to that earliest event time value.

4. A method according to claim 1, wherein the number of time slots in the loop is constant.

5. A method according to claim 4, wherein the number of time slots in the loop is less than 20.

6. A method according to claim 4, wherein the number of time slots in the loop is a prime number.

7. A method according to claim 6, wherein the number of time slots in the loop is 7.

8. A method according to claim 1, including the further step of dynamically varying the number of time slots in the loop.

9. A method according to claim 8, including the further steps of setting the number of time slots in the loop to a minimum value, and then increasing said number of time slots when an attempt is made to insert an event into a time slot that already contains an event with a different event time.

10. A method according to claim 9, wherein the number of time slots in the loop is one of a series of prime numbers.

11. A method according to claim 8, including the step of decreasing the number of time slots in the loop at the end of each simulation run.

* * * * *